Figure 7A:
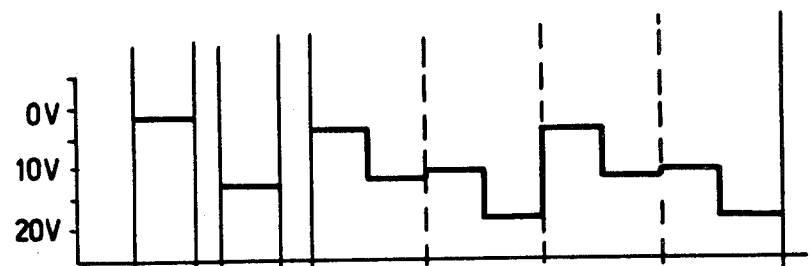

United States Patent [19]
van Santen

[11] 4,131,950
[45] Dec. 26, 1978

[54] CHARGE TRANSFER DEVICE

[75] Inventor: Johannes G. van Santen, Eindhoven, Netherlands

[73] Assignee: U.S. Philips Corporation, New York, N.Y.

[21] Appl. No.: 639,278

[22] Filed: Dec. 10, 1975

[30] Foreign Application Priority Data

Sep. 2, 1975 [NL] Netherlands ............................ 7510311

[51] Int. Cl.² ............................................. G11C 11/40
[52] U.S. Cl. ....................................... 365/183; 357/24
[58] Field of Search ................... 340/173 R; 365/183; 357/24

[56] References Cited

U.S. PATENT DOCUMENTS

| 3,763,480 | 10/1973 | Weimer | 340/173 R |
| 3,889,245 | 6/1975 | Gosney | 340/173 R |
| 3,958,210 | 5/1976 | Levine | 340/173 R |
| 4,007,446 | 2/1977 | Elmer | 340/173 R |

Primary Examiner—Terrell W. Fears
Attorney, Agent, or Firm—Frank R. Trifari; Steven R. Biren

[57] ABSTRACT

A charge transfer device in which series-parallel or parallel-series conversion of information which is present in the form of stored charge packets can take place and in which in a semiconductor body a row of charge storage sites is present in which beside said row several substantially parallel charge transfer registers are provided. The charge storage sites and the registers are interconnected by controllable charge transfer paths in the transverse direction so that charge packets can be distributed from the row between the registers or conversely charge packets distributed between the registers can be transferred to the row of storage sites.

13 Claims, 32 Drawing Figures

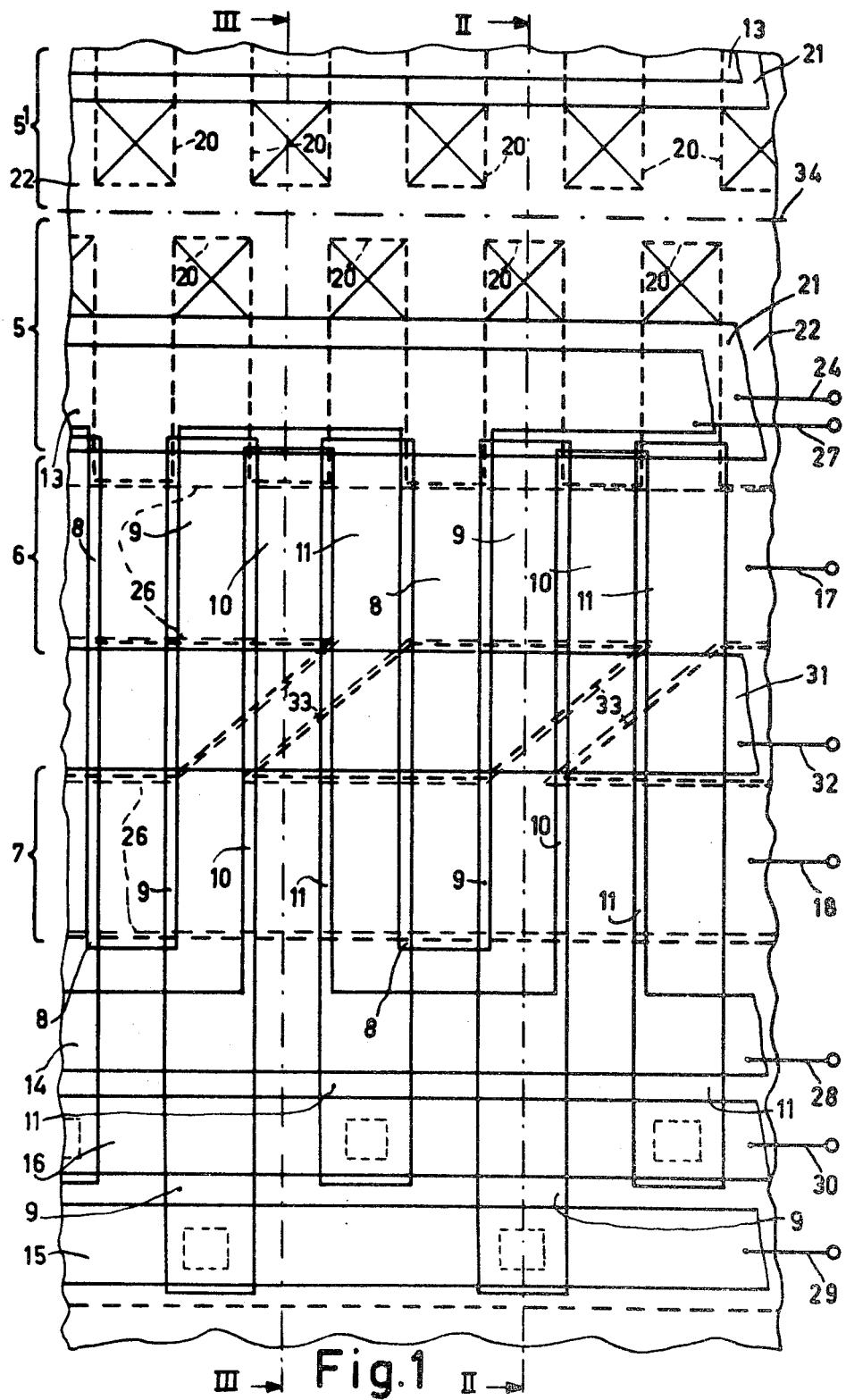

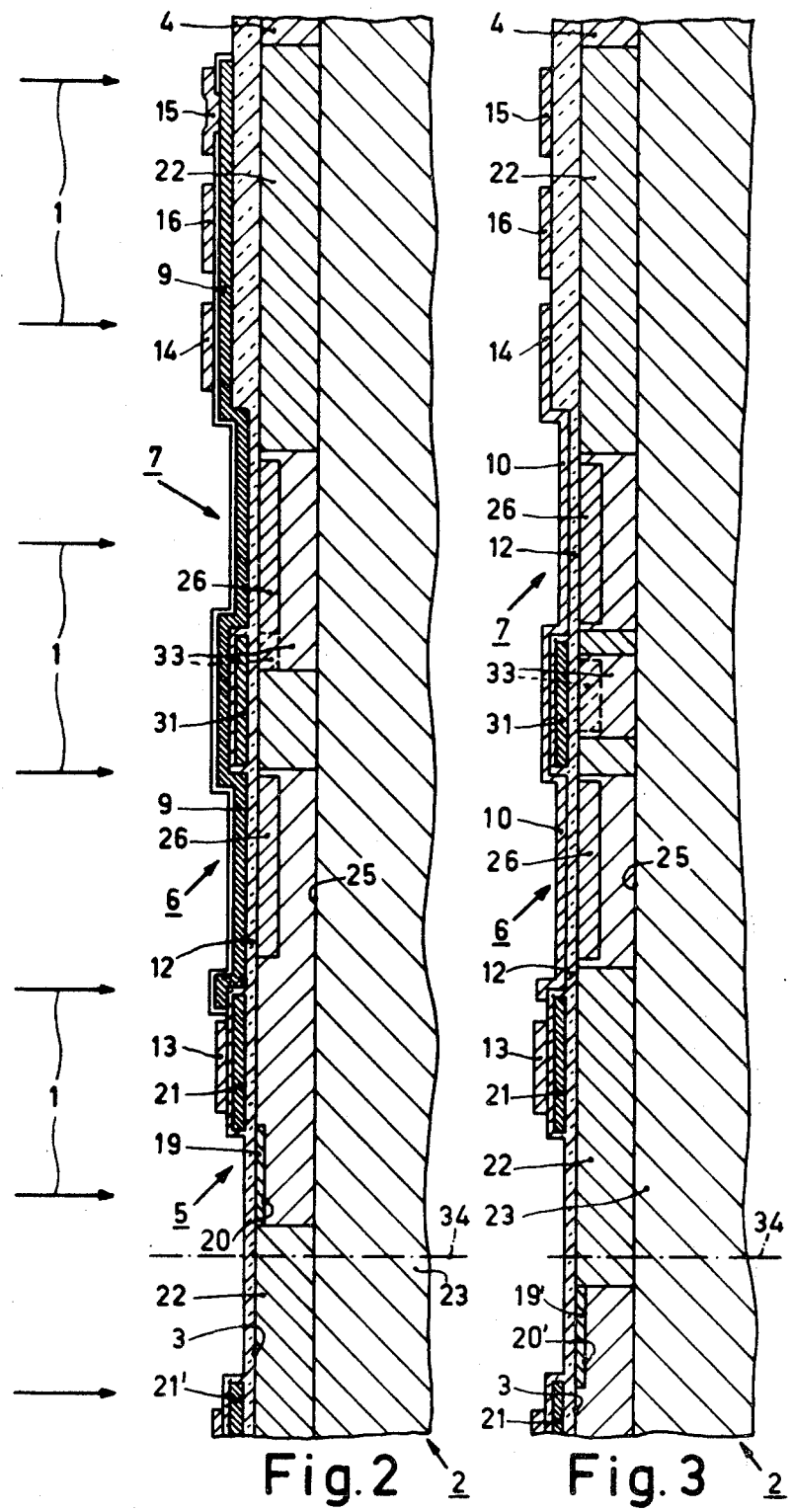

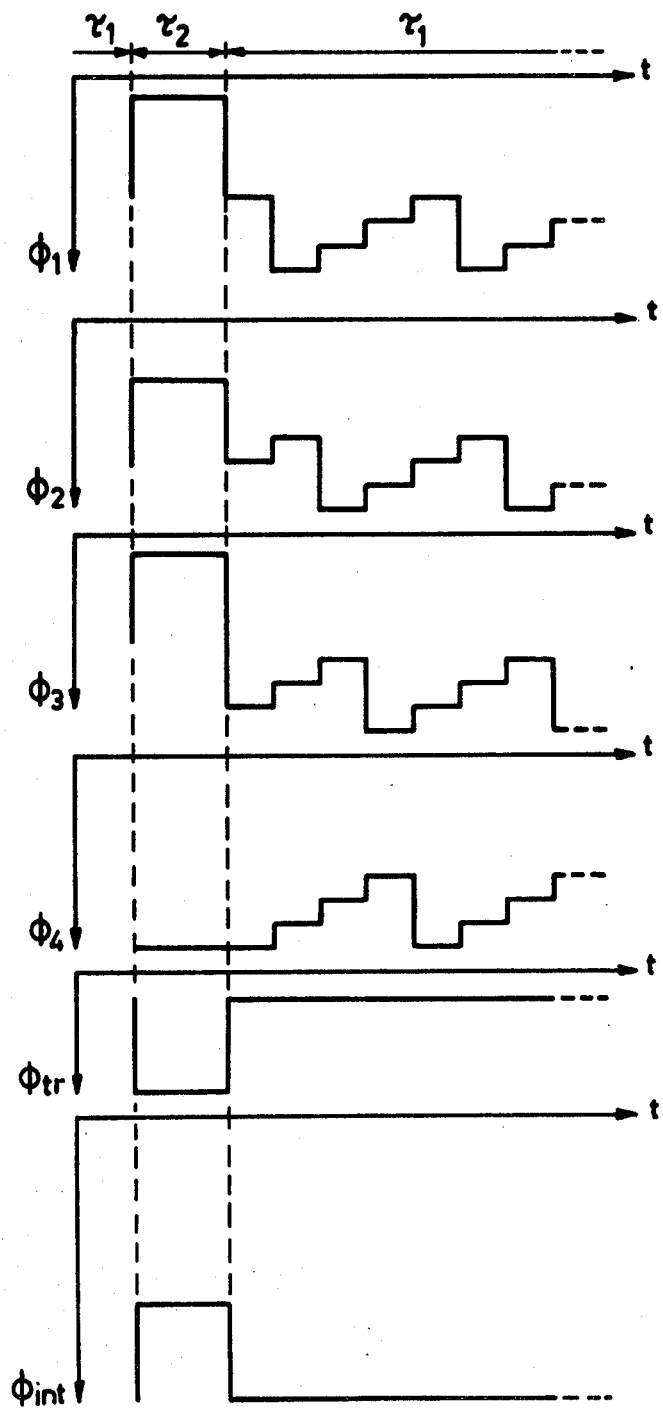

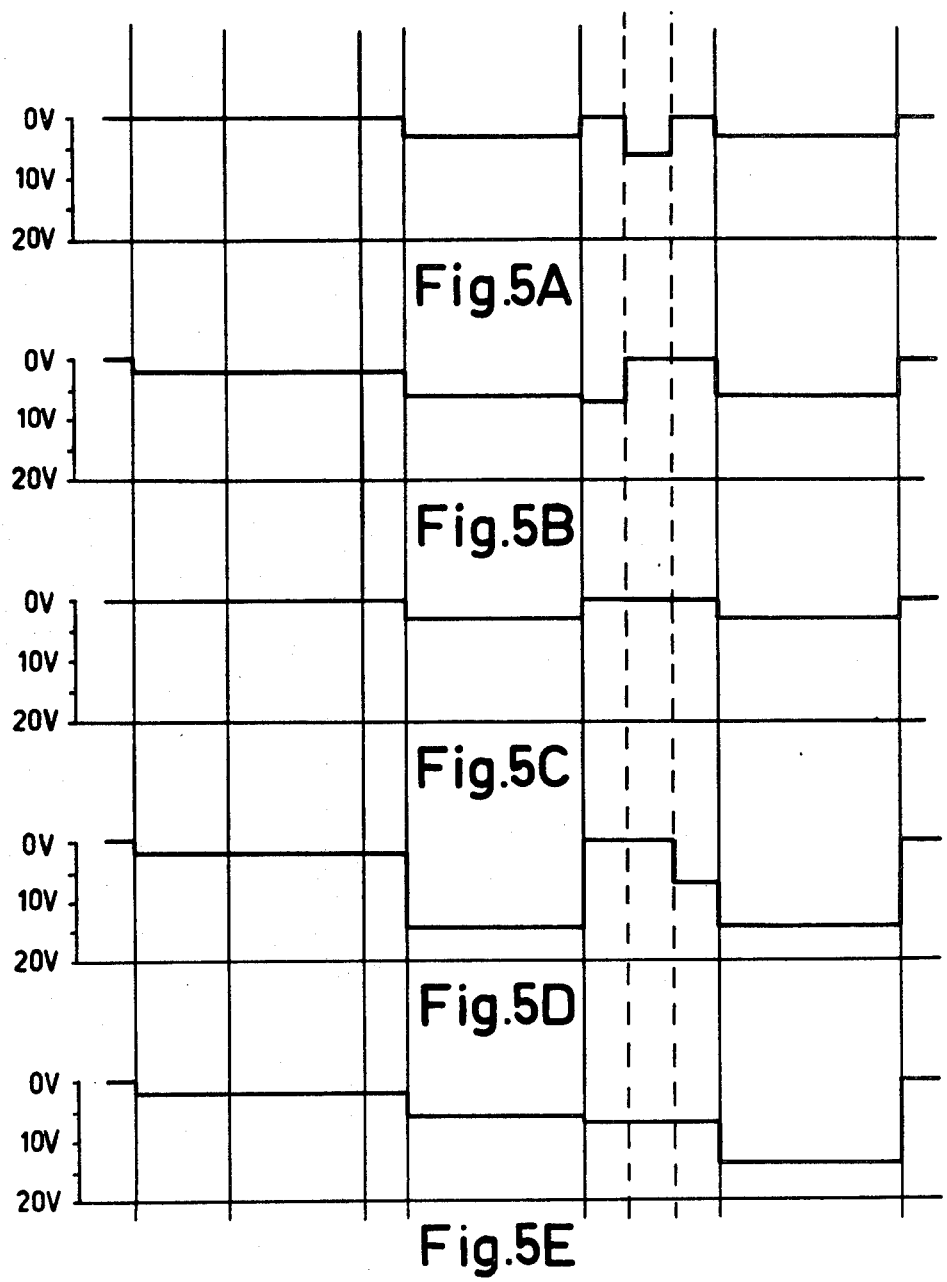

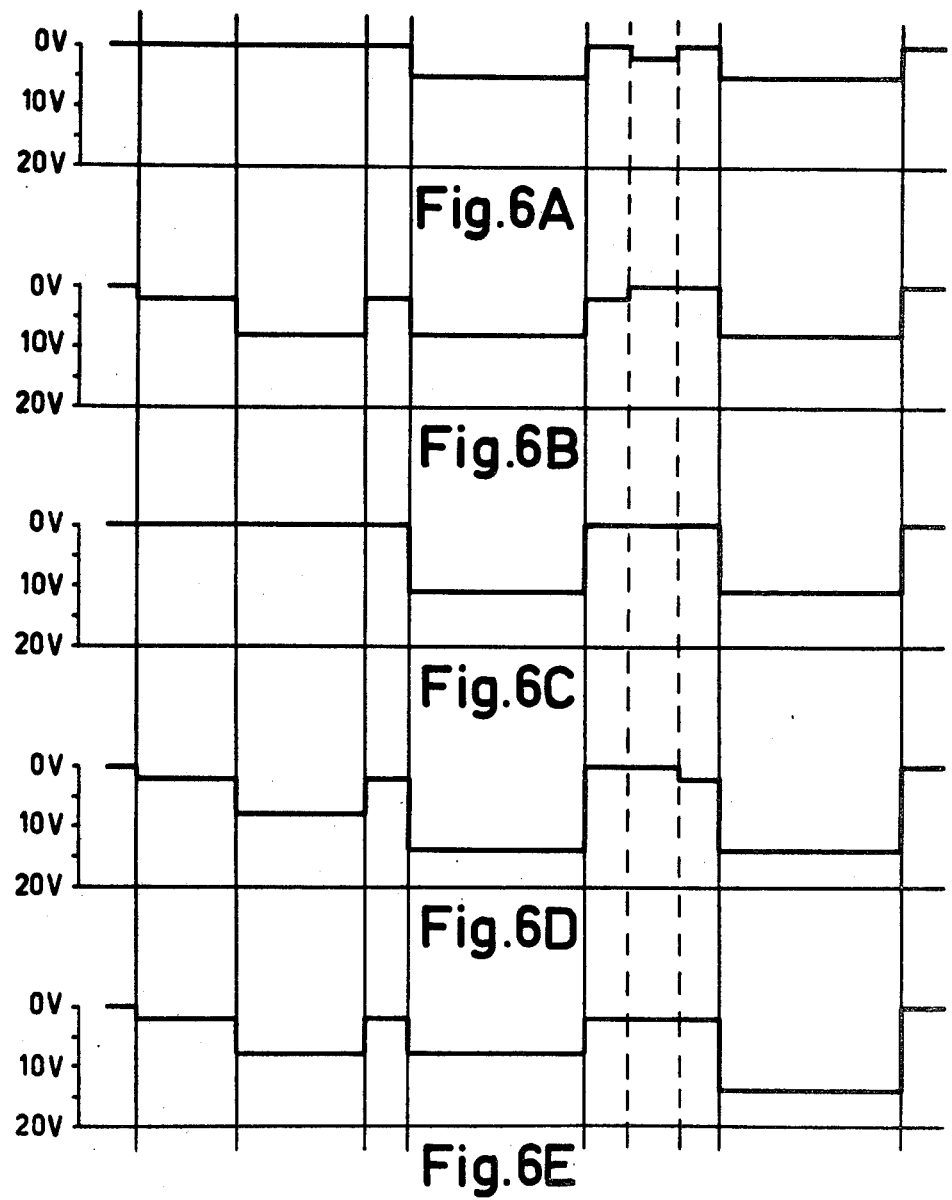

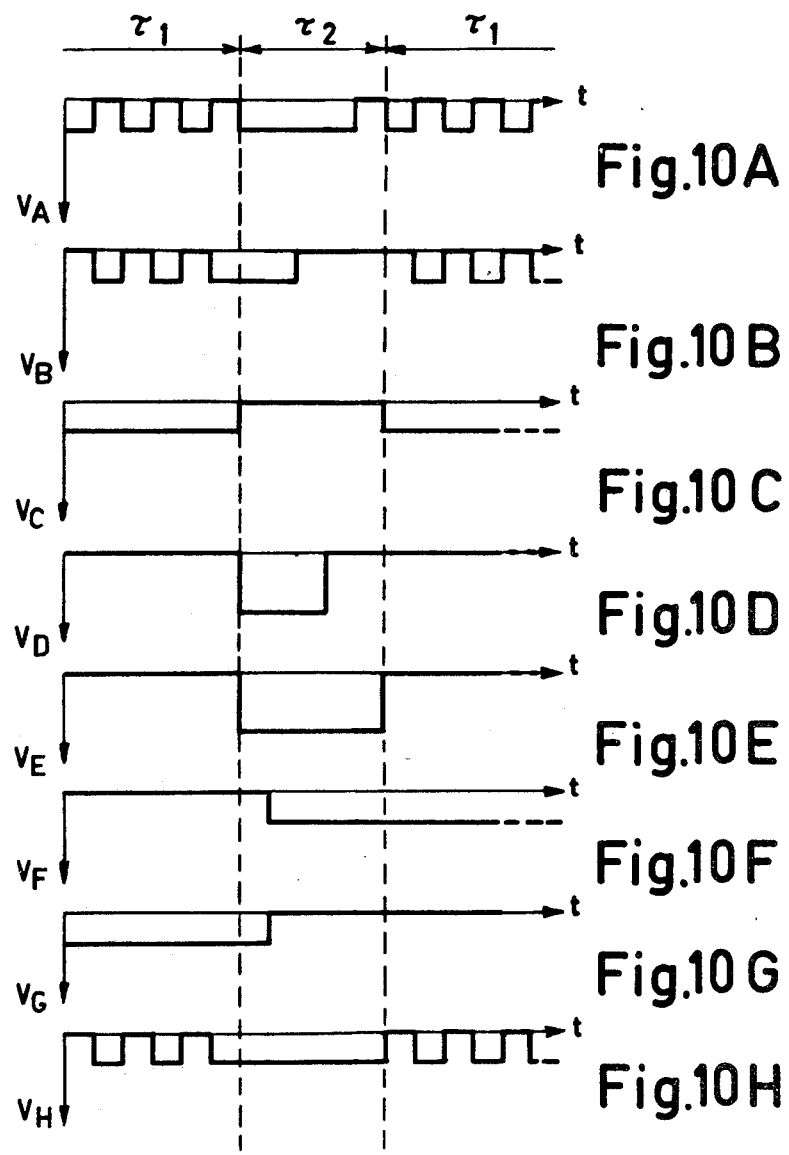

CHARGE TRANSFER DEVICE

The invention relates to a charge transfer device.

Various embodiments of charge transfer devices have already been described, for example, bucket brigade devices, charge-coupled devices having surface transport and charge-coupled devices having bulk transport. In general they comprise a semiconductor body having an array of charge storage sites for storing in the semiconductor body packets of free charge carriers, the size of the charge packets, that is their amount of charge, being used to represent information. Furthermore said devices comprise an electrode system in which, by applying suitable clock signals at the electrodes, charge packets can be transferred from one storage site to a subsequent storage site and subsequently along the row of storage sites to read-out means or output means situated near the end of the row. The array of charge storage sites and the electrode system together constitute a shift register.

Not only have said charge transfer registers already been described in many embodiments, several applications based on this principle are also known already. They can be used, for example, in image pick-up devices or sensors, in which one or more charge transfer registers themselves are radiation-sensitive and the charge storage sites of the register also constitute the pick-up elements or, for example, a row of radiation sensitive or pick-up elements, for example, semiconductor diodes are present, the charge pattern of which after a certain integration time is simultaneously transferred in parallel to a charge transport register, after which said charge pattern in the register is transferred to read-out means and becomes available as a sequential (video) output signal. In this latter case the transport in the register usually takes place during the following integration period during which a new charge pattern is built up in the row of pick-up elements.

Other known applications are inter alia electronic filters and so-called series-parallel-series or SPS memories. Briefly, it further suffices to refer, for example, to the published Netherlands Patent Applications 66.15057, 68.05705, 68.05706, 70.14136, 71.12720, 71.14770, 73.03778, 73.11600, 73.16495 and 74.01939.

In various of the integrated circuits having charge transfer registers it occurs that the information content of a row of memory elements or charge storage sites is presented simultaneously to a charge transport register to be subsequently transported through said register to an output stage where the information content becomes available in sequential form. In the integrated circuit the density of the charge storage sites, that is the number of charge packets per unit of length which can be presented to the charge transport register, is restricted and is maximally equal to the number of charge packets per unit of length which can be present simultaneously in the charge transfer register and can be transferred through the register. Although technologically it would often be possible as such to increase the density of charge storage sites in the semiconductor body, this makes no sense because the charge transfer register cannot process such a larger information density.

In line sensors, that is to say, image pickup devices having a line of image pick-up elements, it is already known to increase the density of the pick-up elements by a factor two in that on both sides of the line of sensor or pick-up elements a charge transport register is situated, one register processing the content of all the pick-up elements having an odd serial number and the other one processing the content of the pick-up elements having an even serial number. See, for example, "New approaches to solid-state cameras" in "Electronics and Power", July 1972, p. 940.

Generally, upon conversion from parallel processing to series processing — and often also conversely upon transformation from series to parallel — the problem occurs that the information content per unit of length transverse to the flow of information in the parallel processing must correspond directly to the information content per unit of length parallel to the flow of information in the serial processing, in which often in particular the last information density is decisive of the semiconductor area required for the solid state circuit.

One of the objects of the present invention is to shift said practical limit in a favorable direction and the invention is based on the recognition of the fact that a larger density transverse to the parallel flow of information can be realized and permitted if the presented information can simply be distributed between several juxtaposed charge transfer registers and that in particular the principle of charge transfer is particularly suitable to realize transverse connections between the adjacent charge transport registers with which the endeavored distribution of the presented information between said registers can be effected.

According to the invention, a charge transfer device comprises a semiconductor body having a row of charge storage sites for storing mutually separated charge packets and N charge transfer registers arranged substantially parallel beside each other and each having an array of electrodes which are separated from a semiconductor layer of the semiconductor body by a barrier and which form an array of capacitances with the underlying semiconductor material in which charge packets can be stored and be transported along the array to read-out means and in which between the row of charge storage sites and the adjacent register and between adjacent registers electrodes are present which are also separated from the semiconductor layer by a barrier and with which charge packets stored in the row of charge storage sites can be distributed between the registers, in which each of the registers receives $(1/N)^{th}$ part of the number of charge packets to be distributed, in which for each of the registers the charge packets to be received are originally separated from each other in the row of storage sites by (N-1) charge packets to be distributed between the registers, and in which the charge packets to be received by the $n^{th}$ register ($n \leq N$) are transferred to the $n^{th}$ register through the semiconductor layer by means of the intermediate electrodes and via the (n-1) registers present between the $n^{th}$ register and the row of storage sites so as to be transported along the array of capacitances of said $n^{th}$ register to the read-out means of said register.

By distributing, in the case of parallel-series conversion, the presented information between several charge transport registers, in which in each of the said registers a proportional part of the information is transported to the associated read-out stage and in which the information content of said registers can usually be combined again at the output in a simple manner, a considerable improvement is obtained. Characteristic of the way of distribution in this case is that transverse connections are present between the registers to that information can be transferred from one register to the adjacent register in a direction transverse to the register.

The number of parallel arranged transfer registers N is preferably equal to 2.

In an advantageous embodiment of the charge transfer device according to the invention the number of storage sites per unit of length of the row of charge storage sites is not larger than and preferably is equal to the number of capacitances per unit of length of at least the first charge transfer register present nearest to said row in which mutually separate charge packets can simultaneously be stored. In this embodiment the fact is used that during the transfer in a charge transfer register the number of capacitances occupied by an information-representing charge packet is smaller than the overall number of capacitances because only then can transfer with small interference be obtained if the transport always takes place from an occupied capacitance to a non-occupied capacitance. For example, in a 2-phase charge transport register in which an asymmetric potential well is generated below each of the electrodes, maximally every second charge storage capacitance can comprise a charge packet which is transported to the output. However, as long as the register is stationary, that is the voltages applied to the electrodes are kept constant, charge packets can be stored simultaneously in all charge storage capacitances if suitable voltage values are applied. Said charge packets remain separated from each other as long as every second capacitance is brought at the usual reference level in that the information content thereof is transferred to a second similar transfer register before clock signals for the transfer to the read-out stage are applied to the electrodes.

Although this is not necessary, the parallel arranged charge transport registers are preferably of the same type and construction. In an advantageous embodiment, corresponding electrodes of the charge transport registers are connected together so that the charge transfer in said transfer registers is controlled with the same clock signals.

An important embodiment of the charge transfer device according to the invention is characterized in that the charge transfer paths between two adjacent transfer registers along which information can be transferred from one register to the other are controlled by means of a common electrode which extends across said transfer paths.

A further important embodiment of the charge transfer register according to the invention in which corresponding electrodes of the charge transfer registers are connected together, is moreover characterized in that the charge transfer paths between adjacent charge transfer registers along which information can be transferred from one register to the other, are present between first capacitances of the one register and second capacitances of the adjacent other register, in which for each of the first capacitances the electrode belonging to said first capacitance forms part of a group of interconnected corresponding electrodes other than the electrode belonging to the second capacitance coupled to said first capacitance by a charge transfer path. The connecting charge transfer paths are preferably provided so that the distributed information is ultimately stored in the N registers in the form of charge packets in capacitances which are all connected to the same common conductor or clock line.

In this manner the charge distributed between the charge transfer registers can be simultaneously transferred to the read-out stages of said registers. This means a comparatively simple organization in which in an otherwise known manner the output signals appearing at the read-out means can simply be summed, for example, by well choosing the length of the transfer registers such that successive registers are always one or two capacitances longer, a sequential signal being formed the sequence of which corresponds exactly to the location of the site in the row of storage sites from which the relevant information content originates.

The charge storage sites of the row preferably form part of or are at least coupled to a row of sensor or pick-up elements. This line sensor constructed according to the invention has important advantages as compared with the so far known line sensors. The row of pick-up elements can become considerably shorter with the number of elements remaining the same, so that the length-width ratio which in the usual sensors often is unfavorable due to the large number of desired pick-up elements is improved. This advantage is of importance in particular for line sensors, because as a result of this considerable saving of the required semiconductor area becomes possible. In the usual line sensors having 500 to 1000 or more picture pick-up elements the required semiconductor area is determined by the length of the line of pick-up elements and by the minimum admissible width associated with the length from the point of view of handleability of the semiconductor crystal. Said minimum admissible width is much larger than is required for the line of pick-up elements and the associated charge transfer registers. Doubling of the number of registers provides a saving of semiconductor material by more than a factor two, because the width determined by the handleability mostly increases more than linearly with the length of the crystal.

Figure 7B:
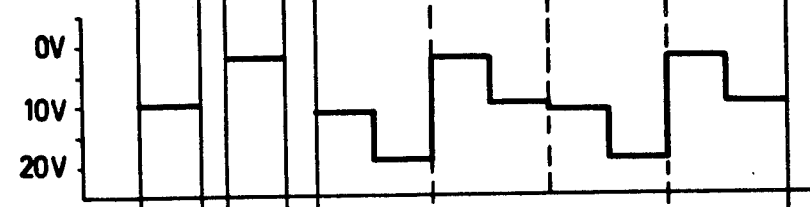
Figure 7C:
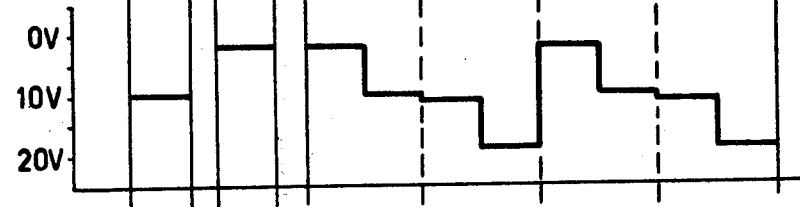
Figure 8:
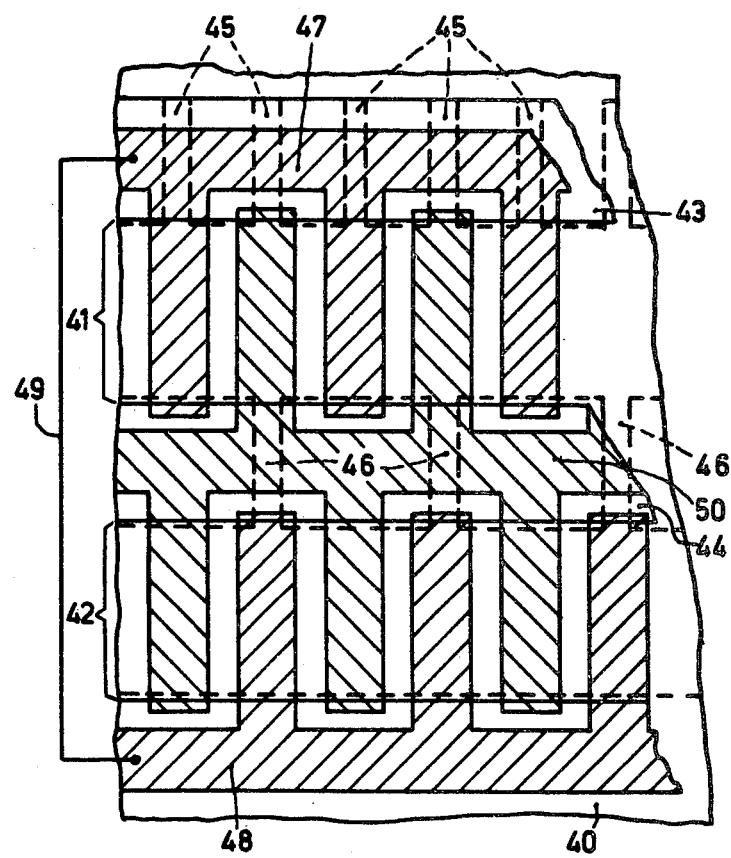
Figure 9:
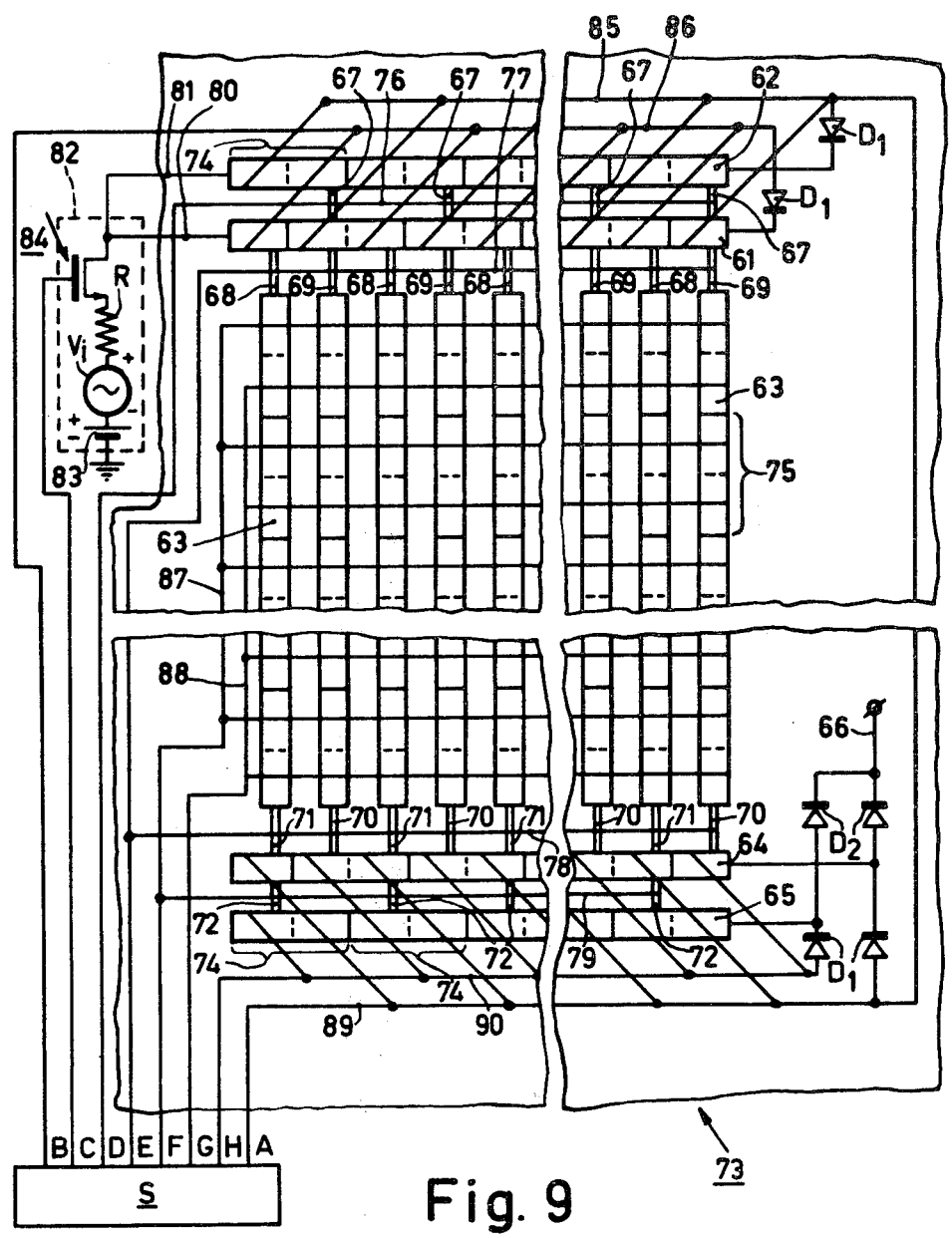

The invention will be described in greater detail and will be explained with reference to the accompanying diagrammatic drawings, in which FIG. 1 is a plan view of a part of an image pick-up device according to the invention, FIG. 2 is a cross-sectional view of the device shown in FIG. 1 taken on the line I1 — II, FIG. 3 is a cross-sectional view taken on the line III — III of the device shown in FIG. 1, FIGS. 4A to 4F show a number of voltages for operating the device shown in FIGS. 1, 2 and 3 as a function of time, FIGS. 5A to 5E show minimum potentials occurring at the position of a number of cross-sections of the device shown in FIGS. 1, 2 and 3 during the transfer time $p2$ shown in FIG. 4, FIGS. 6A to 6E show the minimum potentials during a part of the integration time $\tau 1$ occurring for the same positions at the FIGS. 5A to 5E, FIGS. 7A, 7B and 7C show minimum potentials for three different instants in 2-phase operation of the device shown in FIGS. 1, 2 and 3, FIG. 8 is a plan view of a part of a further embodiment of the device according to the invention, FIG. 9 shows diagrammaticaly the construction of a further embodiment of the device according to the invention and FIG. 10A to 10H show a number of voltages as a function of time for the operation of the device shown in FIG. 9.

FIG. 1 is a plan view of a line sensor according to the invention intended for receiving a linear radiation pattern and converting same into an electric signal. The radiation pattern which can be received via the top side of the device is denoted diagrammatically by the arrows 1 in the cross-sectional view shown in FIG. 2. The device comprises a semiconductor body 2 of silicon but instead of silicon it may also consist of other suitable semiconductor materials. The body 2 comprises a layer 4 which adjoins the surface 3 and which is mainly of the n-type conductivity and which in this example is present on a p-type sub-layer 23 which in this case forms the substrate.

Present in the layer 4 is a row 5 of photosensitive elements which each can convert absorbed incident radiation 1 into charge carriers which can be stored in the form of charge packets in the photosensitive elements during an integration time before being read-out.

In behalf of the reading-out, the layer 4 comprises read-out means comprising inter alia a charge transfer register 6 and a charge transfer register 7. In the present embodiment said charge transfer registers are formed by charge-coupled devices having bulk transport, sometimes referred to in literature as bccd or as pccd. Instead of these, other types of charge transfer registers, for example, bucket brigade devices or charge-coupled devices having surface transport may also be used. The charge transfer registers comprise an array of electrodes 8, 9, 10 and 11 arranged on an insulating layer 12 which is provided on the surface 3 of the body 2 and which separates the electrodes from the underlying semiconductor material.

It is to be noted that the electrodes 8 and 10 are actually formed by the projecting parts of two comb-like electrode structures the strip-shaped base portions of which, which interconnect the electrodes, are referred to by reference numerals 13 and 14, respectively. The electrodes 9 and 11 are conductor strips which are connected together by strip-shaped conductors 15 and 16, respectively. It is furthermore to be noted that the insulating layer 12 which is assumed to be transparent and which usually consists of silicon oxide but for which other materials may also be used is not shown in FIG. 1 for clarity.

The electrodes 8, 9, 10 and 11 constitute with the underlying semiconductor material of the semiconductor layer 4 an array of capacitances via which information in the form of charge packets can be shifted to the read-out or output means shown diagrammatically in FIG. 1 as contacts 17 and 18, respectively, with the semiconductor layer 4.

The image pick-up device according to the present embodiment belongs to the type of sensors in whih the radiation sensitive elements are separated (laterally) from the charge transfer register. As compared with image pick-up devices in which the charge transfer register also constitutes the photosensitive elements, this type of pick-up device has important advantages, inter alia, the advantage that after every integration time the charge packets can be transferred to the charge transfer register and then can be screened from incident radiation 1 during reading-out.

The radiation sensitive elements of the row 5 each comprise a photodiode having a p-type surface zone 19 adjoining the surface 3 and constituting with the n-type semiconductor layer 4 a photosensitive p-n junction 20. In addition, the photosensitive elements each comprise a gate electrode 21 which is provided on the insulating layer 12 present on the surface 3 and is situated beside the corresponding photodiode and adjoins the same, at last when viewed on the surface 3. In the embodiment described the gate electrodes 21 are constructed as a continuous elongate strip of a conductive material, but it will be obvious that the gate electrodes 21 may also be provided in the form of a number of layers of a conductive material separated from each other. The gate electrodes 21 together with the underlying material of the semiconductor layer 4 constitute an array of capacitances in which charge carriers which are obtained by absorption of radiation in and/or near the p-n junctions 20 can be stored during the integration time interval before being transferred to the charge transfer device 6.

The p-type zones 19 comprise electric connections 22, 23 and the gate electrode or gate electrodes 21 comprise an electric connection 24. Via said connections, voltages can be applied to the zones 19 and the gate electrodes 21 — independently of each other — which voltages are desired with a view to a favorable operation of the device. As appears from the figures, the p-type surface zones 19 are not each provided with a separate connection but with a connection which is common for all the zones 19 of the row 5. Similarly, the connection 24 constitutes a common connection for the gate electrodes 21.

The common connection 22, 23 of the p-type surface zones is formed by an adjoining p-type surface region 22 which extends from the surface 3 to the side of the layer 4 present opposite to the surface 3. On this side the p-type region is connected to the p-type substrate 23 which constitutes with the n-type semiconductor layer 4 the p-n junction 25 and with the p-type surface region 22 forms part of the electric connection 22, 23 of the p-type surface zones 19.

The charge storage regions of the photosensitive elements are formed by the parts of the semiconductor layer 4 which are present below the p-type surface zones 19 and the adjoining gate electrodes 21. For that purpose the thickness and the doping concentration of the semiconductor layer 4 at the area of the photodiodes 19 and the gate electrodes 21 are chosen to be so low that depletion regions can be formed extending throughout the thickness of the semiconductor layer 4 and constituting charge storage areas for electrons.

In addition the region 22 forms a lateral boundary of the photosensitive elements. The mutual boundary between the photosensitive elements is formed by the p-type fingers which extend laterally in the layer 4 and, from the surface 3, also extend down to the substrate 23. The fingers extend to below the gate electrodes 21 and up to the charge transfer register 6. The charge storage sites below the gate electrodes 21 — which are preferably present between the photodiodes 19 and the charge transfer register 6 to obtain a structure which is as compact as possible in the longitudinal direction of the line — are thus also separated from each other by the p-type fingers.

In a specific embodiment of a device according to the present example the semiconductor substrate 23 has a thickness of approximately 250 $\mu$m and a doping concentration of approximately $2 \times 10^{14}$ atoms/cc. The other dimensions are assumed to be sufficiently large to be able to comprise the device entirely. In this specific example the n-type semiconductor layer 4 is formed by an epitaxial layer which is deposited on the substrate 23 and has a thickness of approximately 2 $\mu$m and a doping concentration of approximately $10^{15}$ atoms/cc. Besides by epitaxy such a layer could of course also be obtained by means of ion implantataion of suitable atoms, for example phosphorus, in the substrate 23 succeeded by a diffusion treatment.

The p-type region 22 the doping concentration of which is not critical can be obtained by diffusion of boron atoms from the surface 3 of the semiconductor body 2. It forms the lateral boundary of the photosensitive regions and the charge storage sites of the pick-up elements, and serves as well to provide the boundary and the mutual separation of the charge transfer registers 6 and 7.

The p-type surface zones 19 can be obtained, for example, by means of ion implantation of a p-type impurity in the epitaxial layer 4 with an implantation dose of approximately $10^{14}$ atoms/sq.cm. and an implantation depth of approximately 0.3 $\mu$m. Also by means of ion implantation, in the charge transfer devices the doping concentration of the N-type surface region 26 of the epitaxial layer 4 can be increased at the surface 3 by an implantation dose of approximately $2 \times 10^{12}$ atoms/sq.cm. and an implantation depth of approximately 0.3 $\mu$m. The more heavily doped region 26 extends along substantially the whole surface of the charge transfer register and serves, as is described inter alia in Dutch Patent Application 73.03778, to increase the charge handling capability of the charge-coupled devices. The more highly doped region 26 is denoted by broken lines in FIG. 1.

The insulating silicon oxide layer 12 has a thickness of approximately 0.1 $\mu$m. The electrodes 21 are formed by a layer of doped polycrystalline silicon which has been given a pattern in the usual manner by means of photolithographic etching. After said first layer of polycrystalline silicon, a second layer of polycrystalline silicon has been provided from which the electrodes 9 and 11 are obtained. The mutual isolation between said two layers is formed by an oxide obtained by the partial oxidation of the first polycrystalline semiconductor layer. The second polycrystalline semiconductor layer is also covered by an oxide layer. The electrodes 8 and 10 of the charge transfer registers, as well as the connection conductors or clock lines 13, 14, 15 and 16, are formed by a layer of aluminum. The clock lines have connections 27, 28, 29 and 30, respectively, shown diagrammatically. Simultaneously with the provision of said electrodes and clock lines, contacts, for example the output contacts 17 and 18, may also be provided.

The charge transport device described so far thus has a semiconductor body 2 having a row 5 of storage sites 19, 21 for storing charge packets which are separated from each other and several substantially parallel juxtaposed charge transfer registers 6 and 7, respectively. Each of the charge transfer registers has an array of electrodes 8, 9, 10 and 11 which are separated from a semiconductor layer 4 of the semiconductor body 1 by a barrier which in this case is formed by insulating layer 12. Said electrodes 8 to 11 together with the underlying semiconductor material and the intermediate barrier constitute an array of capacitances in which charge packets can be stored and transferred along the array to read-out means which in this example may simply consist of conductive contacts 17 and 18, respectively, to the semiconductor layer 4 present near one end of the array of capacitances.

Present between the row 5 of charge storage sites and the adjoining charge transfer register 6 and between the adjacent registers 6 and 7 are electrodes 21 and 31, respectively, which are also, separated from the semiconductor layer 4 by a barrier formed by the insulating layer 12. The electrode 31 has a connection 32.

Present between the two charge transfer registers are charge transfer paths 33 the boundaries of which are shown in broken lines in FIG. 1. Information can be transferred from the register 6 to the register 7 along said transfer paths 33 which can be controlled with the common electrode 31 present above and across them. The transfer of information from the row 5 of charge storage sites to the first charge transfer register is controlled by means of the electrode 21.

The two charge transfer registers 6 and 7 are known 4-phase bulk transport registers. During the transport of information along a register, charge may be stored below one of every four electrodes so as to keep the stored charge packets separated from each other. For the processing of information the register, per bit of information, has a length which is determined by four juxtaposed electrodes 8, 9, 10 and 11. Said length will hereinafter be referred to as the bit length of the register.

So in the present example the bit length of a register has four capacitances. Although during the transfer along the register not more than one charge packet may be present per bit length, charge packets separated from each other can be stored in two capacitances per bit length, as long as the register is stationary, that is to say, the clock lines are maintained at constant voltages, which will become apparent hereinafter. In the present example this has been used to increase the number of pick-up elements per unit of length. Besides the storage sites below the electrodes 9, the storage sites below the electrodes 11 of the register 6 are also coupled to a sensor or pick-up element of the row 5. The last-mentioned storage sites are coupled via charge transport paths 33, to the charge storage sites below the electrodes 9 of the second register 7. The charge pattern of the row 5 of pick-up elements is distributed between two registers, each of the registers receiving a proportional number of the charge packets, namely each one half. In addition, charge packets are transferred to the second register, which packets, in the original row, each adjoin charge packets which are transferred to the first register. The followed system can simply be further expanded. With 6-phase registers, three juxtaposed registers may be used. When N parallel registers are used, each register receives 1/N part of the number of charge packets to be distributed, the packets to be received for each of the shift registers originating from sites in the original row of storage sites which are (n-1) intermediate sites remote from each other. Of the (N-1) packets of said (N-1) intermediate sites to be distributed between the registers, each of the remaining (N-1) registers receives one.

In the present example the density of the pick-up elements is further increased in that the part of the solid state circuit described so far is provided again on the other side of the axis of symmetry denoted by a dot-and-dash line 34. The resulting rows 5 and 5' of picture pick-up elements together constitute the photosensitive strip of the line sensor, two charge transport registers for readingout the charge pattern of the line being present on either side of said strip.

During operation, the substrate 23 is set up, for example, at a reference potential, for example earth (zero Volt), while the output contacts 17 and 18 are set up at a voltage of, for example, approximately 16 Volts.

Clock signals which vary, for example, between 1.5 Volts and −7.5 Volt may be applied to the electrodes 8, 9, 10 and 11 of the charge-coupled registers 6 and 7 (and 6' and 7'). A voltage which varies between 6.5 Volts and −3 Volts may be applied to the electrode 21 via the connection 24. The voltage at the electrode 31 varies, for example, between approximately −7.5 Volts and −20 Volts. The voltages at the clock lines 14, 16, 13 and 15 and those at the electrodes 21 and 31 are shown as a function of time $\phi_1$, $\phi_2$, $\phi_3$, $\phi_4$, $\phi_{tr}$ and $\phi_{int}$ in FIGS. 4A to 4F. The integration time $\tau_1$ in which information present in the registers is transferred to the read-out means and at the same time a new charge pattern is built-up in the pick-up elements, and transfer time $\tau_2$ in which the charge pattern built up in the pick-up elements is transferred and distribute between the registers, alternate in time.

At the voltages stated, the whole region of the epitaxial layer 4 which is occupied by the photosensitive elements and by the charge transfer registers will be depleted, that is to say that without generation of electrons substantially all electrons present in the said region are drained via the output contacts 17 and 18. During the so-called integration time, a voltage of approximately +6.5 Volts is applied to the electrode 21, while a voltage of 0 Volt is applied to the p-type zones 19 via the p-type zones 22 and the p-type substrate 23. The electrode 31 then is at approximately 20 Volts. Below the p-type zones 19 and the electrodes 21 a potential pattern (for electrons) is obtained which is shown in the second column of FIGS. 6B, 6D and 6E and which shows a minimum below the gate electrode 21. The radiation 1 is incident on the photodiodes 19 and generates holeelectron pairs near the back-biased p-n junctions 20. Since no electrodes are present above the zones 19, the sensitivity to light having a relatively small wavelength (blue light) is also comparatively large. Of the generated electron-hole pairs the holes are drained to the p-type zones 19 and 22 and/or to the substrate 23. The generated electrons can be collected in the potential wells below the electrodes 21. The charge storage capacity below the electrodes 21 is approximately $10^{12}$ electrons per sq. cm. and is considerably larger than the charge storage capacity below the p-type zones 19 which is approximately only $2\times10^{11}$ electrons per sq. cm. The device therefore combines a good radiation sensitivity with a large charge capacity per unit of surface area by separating the functions of absorption of radiation and storage of charge carriers from each other.

FIG. 5 shows diagrammatically the profile or distribution of the minimum of the potential in the semiconductor layer 4 during the transfer time $\tau_2$. FIGS. 5A to 5D show the potential profile at the position of cross-sections in a direction parallel to that of the cross-section shown in FIGS. 2 and 3, FIG. 5A applying at the position of the electrodes 10, FIG. 5B at the position of the electrodes 11, FIG. 5C at the position of the electrodes 8 and FIG. 5D at the position of the electrodes 9. For comparison, FIG. 5E shows diagrammatically the potential profile or pattern in a cross-section which extends at the position of electrode 11 through the picture element and register 6 and subsequently obliquely along the charge transfer path 33 to register 7 and then straight through register 7 at the position of electrode 9.

The potential of the substrate 23 and the p-type zones 22 is shown on the extreme left and on the extreme right. The extreme left first column indicates the potential in the n-type region below the diode zone 19 and that of the p-type zone 22, respectively. The adjoining second column applies to the region below the electrode 21. The third column applies to the n-type region which is covered by the electrodes 9 and 11, respectively, and which extends between the electrode 21 and the more highly doped region 26, and to the p-type zone 22 below the electrodes 8 and 10, respectively. The fourth column represents the potential in the n-type region of the register 6, while the fifth and sixth columns, respectively, represents the potential below the electrode 31 and the potential in the n-type region of the register 7, respectively.

It may be seen from FIGS. 5B and 5D that any charge stored below the electrode 21 in the pick-up elements will flow in this period to the region below the electrodes 11 and 9 of register 6, the region below the electrode 11 adjoining a connection path 33 to the region below the electrode 11 adjoining a connection path 33 to the region below the electrode 9 of the register 7. Charge transport in the direction of transport of the registers is prevented by the potentials below the electrodes 8 and 10. At the end of the transfer time $\tau_2$, all information-representing charge will be present below the electrodes 9.

FIGS. 6A to 6E show the potential profile in the semiconductor layer at the position of the same cross-section as FIGS. 5A to 5E but this time during the first part of the integration time $\tau_1$. The pickup elements are now separated from the register 6 by the potential barriers denoted in the third column at the position of the electrodes 9 and 11 (FIGS. 6B, 6D and 6E), while also in column 5 a potential barrier is visible in the charge transfer paths 33. This barrier separates the contents of registers 6 and 7 from each other.

The electrons generated in the various photosensitive elements can now be transposed packet-wise in the usual manner of charge transfer to the outputs 17 and 18. When register 7 is half a bit length longer than register 6, the signals of the outputs 17 and 18 can simply be summed to a sequential (video) signal, in which sequence in time corresponds directly to sequence of site in the row 5 of pick-up elements. The charge transfer takes place mainly in the interior of the semiconductor layer 4, so at a finite distance from the surface 3, so that loss of information caused by surface states is avoided.

It is to be noted that in the device described the charge transfer registers 6 and 7 serve only to read-out the generated charge pattern and do not themselves form the photosensitive elements. As a result of this it is possible to cover the registers 6 and 7 with a radiation-impervious layer. When all the electrodes are constructed from aluminum, an extra impervious layer will not be necessary in most of the cases. The charge packets which are shifted in the registers 6 and 7 after the integration period can advantageously be screened against radiation 1 during reading-out. Spreading information over various charge packets during reading-out is prevented by this at least for the greater part in this type of picture pick-up devices.

As already noted, the device described relates to a line sensor intended to receive a linear radiation pattern. In order to make the compactness of the device in the longitudinal direction of the line as large as possible, the photodiodes and the associated gate electrodes are provided beside each other in a direction transverse to the longitudinal direction of the line in such manner that the gate electrodes 21 are present between the diodes 19 and the charge transfer device 6.

The device as described with reference to the present embodiment may be expanded to form a two-dimensional image sensor by simply providing a number of the line sensors described beside each other. Such a device presents important advantages inter alia in those cases in which the number of image points in the longitudinal direction of the lines is larger than in the direction transverse to the longitudinal direction.

For completeness' sake it is to be noted that the stated potential distributions of the minimum potential are rough and that the influence of any stored charge carriers and/or charge carriers to be transported has not been taken into account in these distributions.

The invention is not restricted to 4-phase registers. Instead of the 4-phase registers described in which the potential wells below the electrodes are symmetrical, 2-phase registers, for example, with asymmetric potential wells below the electrodes, for example bucket brigade devices, may also be used. The registers described may also be operated as 2-phase registers by externally applying a fixed potential difference between the electrodes 8 and 9 and between the electrodes 10 and 11, respectively. For example, a direct voltage source of, for example, approximately 8 Volts may be arranged between the connections 27 and 29 as well as between the connections 28 and 30 in such manner that the electrodes 9 and 11 are always 8 Volts more positive than the electrodes 8 and 10, respectively. If the voltage of the thus interconnected electrodes 8 and 9 is varied between, for example, −2.5Volts and 6.5 Volts by means of a clock voltage generator, and the interconnected electrodes 10 and 11 vary in opposite phase between the same voltage values, the minimum potential in the semiconductor layer below the electrodes will be approximately as is shown diagrammatically in FIG. 7 for various instants. FIG. 7A shows the potentials during the transfer time $\tau_2$ in which the extreme left column represents the potential below the electrodes 21, the second column represents the potential below the electrodes 31, and the third column represents the potential below the electrodes 10, 11 and 8, 9 in the direction of transport of the registers 6 and 7. The substrate is connected to earth again. The electrode 21 has a potential of, for example, approximately −3 Volts, the electrode 31 has a potential of approximately +0.5 Volt while the electrodes 10, 11 and 8, 9, respectively, are set up at a potential of approximately −0.5 Volt and +6.5 Volts, respectively.

FIGS. 7B and 7C show the minimum potentials below the same electrodes during the second part and the first part respectively, of a cycle of the periodic clock signal during the integration time. In the first part of said cycle a voltage of 6.5 Volts is applied to the electrode 8, 9, while the electrode 10, 11 is at −2.5 Volta. In the second part of said cycle the electrode 8, 9 is at −2.5 Volts, while the electrode 10, 11 then has a voltage of 6.5 Volts. During the whole integration time the electrode 21 is, for example, at approximately 10 Volts and the potential of the electrode 31 is, for example, approximately −20 Volts.

During the integration time the electrode 31 prevents exchange of charge between the registers 6 and 7 from taking place. The built-in threshold in the connection between the pick-up elements and the (partial) electrodes 9 and 11 prevents in this example also that charge of the pick-up elements flows in register 6. Said threshold is caused by the doping difference between the part of the n-type layer 4 adjoining the pick-up elements and present below the (partial) electrodes and the more highly doped n-type region 26.

In the first part of the each cycle (FIG. 7C) transfer of charge takes place from the region below the (partial) electrodes 11 to the region below the (partial) electrodes 9 while in the second part of the cycle (FIG. 7c) charge transfer occurs from the region below the (partial) electrodes 9 to the region below the (partial) electrodes 11.

During the transfer time (FIG. 7A) the charge stored in the pick-up elements connected to the region below the (partial) electrodes 9 will flow to said region. For the other pick-up elements it holds that the charge will flow directly to the region below the (partial) electrodes 9 of the second register via the region below the (partial) electrodes 11 and the connection paths 33 below the electrode 31.

It will be obvious that hence all kinds of 2-phase angle transfer registers may be used, for example, bucket brigade devices and charge-coupled devices having built-in thresholds to obtain asymmetric potential wells below the electrodes. Such thresholds can be realized in various manners, for example, by using a difference in doping of underlying semiconductor material and/or a locally different concentration of charge in the insulating layer and/or a local difference in thickness and/or material of the insulating layer and/or by using different materials for the electrodes.

The image pick-up elements may be, for example, photodiodes or phototransistors or conductorinsulating layer-semiconductor capacitances. When bucket brigade devices are used the connections between the pick-up elements and the first register and the transverse connections between the registers may have the form of insulated gate field effect transistors serving as switches, in which gate electrodes per row of switches may be connected together.

In the embodiment described, charge from pick-up elements is transported directly via the regions below the electrodes 11 of the register 6 to the regions below the electrodes 9 of the register 7 in the transfer time $\tau_2$. This transport may also be carried out in two steps in which during the transfer time $\tau_2$ the electrodes 11 and 9 are at the same potential and the charge of the pick-up elements is stored below said electrodes. The connection between the pick-up elements and the register may then be interrupted by means of the voltage at the electrode 21 and the integration time begins in which a new charge pattern is built up in the pick-up elements. At the beginning of said integration time the voltages at the electrodes of the registers are still left unvaried and first the connection paths 33 are opened by means of the electrode 31. The potential of the electrodes 11 is then brought to the most negative value of the clock voltage. When the potential of the electrode 31 is again brought to its most negative value the charge which was stored below the electrodes 11 of the register 6 has been transferred to the register 7 and is stored there below the electrodes 9. The information may then be transported to the read-out or output stages by means of the usual transfer action. Generally, this latter way of operation will have the advantage that voltage values differing less from each other will suffice for the electrodes.

In the last-described mode of operation, the information content of the row of image pick-up elements is transferred simultaneously to capacitances of the register 6 and then distributed between the registers 6 and 7. It appears that the row of storage sites can coincide with the first register in that sense that the storage sites form part, as capacitances, of the first register. The information content of the row is distributed between the first and the second register in such manner that in this case half of the number of charge packets remains behind in the first register and the other half of the number of charge packets is transferred to the second register.

It will be obvious that the required voltage levels depend inter alia on the doping concentrations below the relevant electrodes and that said voltage levels can be varied by adaptation of said concentrations. For example, in the example described it has been assumed that the more highly doped n-type region 26 extends not only in the registers 6 and 7 but also in the connection paths 33. When the region 26 is restricted to the registers themselves, so when the more highly doped part bounded in FIGS. 2 and 3 by a broken line is omitted, then a built-in threshold is formed between the connection paths 33 on the one hand and the registers 6 and 7 present at either end thereof on the other hand, which threshold enables the electrode 31 to be connected directly and permanently to the electrodes 9 when during the transfer time a more positive voltage of, for example, 15 Volts is applied to the electrodes 9.

In the examples, the electrodes 8, 9, 10 and 11 are constructed as straight strips extending transversely to the registers, while the connection paths 33 in the semiconductor body extend obliquely from electrode 11 to electrode 9. However, the connection paths 33 may also extend straight and transversely to the registers, the electrodes 8, 9, 10 and 11 extending obliquely between the registers and in this manner varying their position from register to register. When more than two registers are used, dependent on the embodiment, the connection paths or the oblique connections in the electrodes may be in the elongation of each other from register to register or, for example, also extend according to a zig-zag pattern. During the transport in the registers to the readout or output stages, the information is present in the various registers below electrodes which convey the same clock voltage. If necessary, several electrodes can be arranged behind each other above the connection paths between the registers, so that the information in the connection paths is transported along several storage sites. With this number and/or the voltages applied to said electrodes, the overall stay or delay of the information in the connection paths can be controlled and be adapted so that the information from a connection path is presented to a register at the correct instant, namely when below the relevant electrode of the register a potential minimum for the free charge carriers is present. Preferably, however, such an extra delay in the connection paths which, it is true, can be compensated for with the length of the registers to regain at the output the original sequence of the charge pattern, is avoided.

As in the examples described, the number of storage sites per unit length in the row 5 is preferably equal to the number of capacitances per unit of length of the register 6 in which charge packets which are separated from each other can be stored. The 4-phase register 6 has four electrodes, so four capacitances per bit length. However, during the transport along the register only one bit of information per bit length may be present, while, as long as the register is stationary, two bits separated from each other can be stored. In connection herewith, precisely two image pick-up elements are arranged in the row 5 per bit length of the register 6. In certain circumstances, however, this rule may be deviated from. In registers having a larger number of phases, the number of storage sites in the row could be smaller than the number of separate capacitances of the register. The number of storage sites in the row may also be larger than the number of separate capacitances of the register. For example, when using bucket brigade devices a row of field effect transistors may be provided as switches between the storage sites of the row and the storage capacitances, each storage capacitance which is to receive a charge packet from an image element being connected via two separately controllable switches to two separate image pick-up elements, in which first the content of one pick-up element is transferred to the memory capacitance and then transmitted to a further register, after which the content of the second pick-up element is transferred to the same storage capacitance of the first register.

In another variation, by distributing the electrodes suitably into groups for controlling transverse connections, 3-phase registers having symmetric potential wells below the electrodes may also be used. When first the connection path between a first pick-up element and an electrode of a first register connected to the first phase is opened and a charge packet is transferred and said connection is then interrupted and the connection between said register capacitance and the capacitance of a second register formed by an electrode connected to the second phase is opened and the charge packet is temporarily stored in said connection path by means of the voltage at the first phase, this packet may then be transferred to the capacitance of the second register and simultaneosuly, or afterwards, the current of a second element may be transferred to the adjacent electrode of the first register connected to the second phase. This procedure may then be repeated but this time so that charge of the capacitances below the second phase is transferred to capacitances below the third phase in the subsequent register. The information may then be transported to the read-out stages by means of the usual 3-phase transport action.

FIG. 8 shows still another electrode structure which is suitable notably when using 2-phase registers. The semiconductor body 40 has two parallel arranged registers 41 and 41, for example bucket brigade devices, which are not further shown in detail. Present on either side of the register 41 are electrodes 43 and 44, respectively, to control information transfer of, for example, a row (not shown) of image pick-up elements to the register 41 and to control the transfer of information from the register 41 to the register 42, respectively. This transfer of information takes place by means of charge transfer through charge transfer paths 45 and 46, respectively. There are twice as many charge transfer paths 45 as there are charge transfer paths 46 in connection with the fact that half of the information supplied to the register 41 through the paths 45 remains behind in said register and the other half is transferred to the register 42. The charge transfer paths 45 and 46 extend substantially at right angles to the registers 41 and 42 and each transfer path 46 is situated in the elongation of a transfer 45. The electrode system adapted hereto of the registers 41 and 42 has a rake structure 47 the base of which extends parallel to the registers and above the electrode 43 and a rake structure 48 shown in the lower side of the figure. Said rake structure 47 and 48 together constitute the one phase and may be connected together via a connection 49. The other phase is formed by rake structure 50 the base of which is present between the registers and above the electrode 44. Said base comprises on either side extensions or teeth extending alternately above the register 41 and above the register 42.

The line sensors described so far may form part of a two-dimensional image sensor which is constructed from a number of parallel arranged line sensors. However, they may also form single line sensors. In this latter case and in particular in line sensors having a large number of pick-up elements of, for example, 500 or more, the application of the invention involves a considerable saving of the required semiconductor area. This saving is associated with the more favorable length-width ratio of the line. In practice, in line sensors the size of the required semiconductor crystal is determined by the length which is required for the row of pick-up elements. Said length is usually so large that the width of the crystal is determined by requirements of handleability of the crystal, in which the width is to be chosen to be considerably larger than is actually necessary for the row of pick-up elements and the registers provided on either side of said row. The improved length-width ratio of the line sensor itself thus results in a reduction of the size of the required crystal. In addition, the minimum admissible width from a point of view of handleability usually increases more than proportionally with the required length of the crystal.

The present invention is not restricted to sensors but is generally suitable for use in parallel-series or series-parallel conversion. FIG. 9 shows diagrammatically a series-parallel-series memory which is known per se and is described, for example, in Netherlands Patent Application 71.12720, in which information in the form of charge packets is presented at the input of a register 61. When the register 61 is full, the contents thereof is simultaneously transferred to a number of parallel registers 63. At the end of the registers 63, transfer of the information takes place again to a register 64 after which said information is transported to the output of said register and becomes available as a sequential signal at 66. So in this memory both a series-parallel conversion and a parallel-series conversion take place.

According to the invention, a second register 62 is present at the input beside the register 61, charge transfer paths 67 being provided between the first register 61 and the second register 62. Besides the charge transfer paths 68 between the register 61 and the parallel register 63 which are also present in the so far known SPS memories, intermediate charge transfer paths 69 are present so that, with the length of the register 61 remaining the same, the number of parallel registers 63 may be doubled.

In a corresponding manner are also provided at the output a second register 65 and, in addition to the transfer paths 70, further transfer paths 71 and 72.

For example, the device is constructed with bucket brigade devices in which the charge transfer takes place in the form of transfer of electrons. The semiconductor body 73 is mainly of the p-conductivity type. Bucket brigade devices 61, 62, 63, 64 and 65 are realized in said body by means of n-type surface regions and electrodes separated from the semiconductor body by an insulating layer to form charge transfer registers. The registers are 2-phase registers, the bit length of the registers 61, 62, 64 and 65 being equally large and shown at 74. The bit length of the register 63 is shown at 75.

The registers 61 and 62 are shifted relative to each other by half a bit length and the same applies to the registers 64 and 65. Present at the end of said registers are reset means, as is usual, in this case in the form of a diode $D_1$.

At the beginning of the registers 63 facing the top side of FIG. 9 are present charge storage sites or capacitances, as already described, for example, in the above mentioned Netherlands Patent Application 71.12720. The connection paths 67, 68, 69, 70, 71 and 72 constitute, together with the electrodes 77, 76, 78 and 79 for controlling said paths, switches which are constructed as n-channel insulated gate field effect transistors.

The inputs 80 and 81 of the input registers 61 and 62 are connected to an input circuit 82 shown in broken lines. This input circuit 82 may be integrated in the semiconductor body 73 for a greater or smaller part and may consist, for example, of a direct voltage source 83 which supplies a voltage of the indicated polarity and the value of which is approximately equal to half the amplitude of the clock voltages used for the registers 61 and 62, an input signal source shown by the alternating voltage source $V_i$, a series resistor R and an n-channel field effect transistor 84 with which the connection between the input signal source $V_i$ and the inputs of the registers 61 and 62 can be interrupted temporarily, if necessary. Of course, other usual input circuits may also be used.

The registers 61 and 62 have common clock lines 85 and 86 which are connected to the connection A and B respectively of a switching voltage source or pulse generator S. Said pulse generator may be integrated substantially entirely or partly in the semiconductor body 73. The common clock lines 87 and 88 of the registers 63 are connected to the connections F and G respectively of the pulse generator S. The common clock lines 89 and 90 of the registers 64 and 65 are connected to the connection A and H respectively of the pulse generator S. The frequency of the clock signals $V_F$ and $V_G$ of the parallel registers is lower than the frequency of the clock signals $V_A$, $V_B$ and $V_H$ of the series registers 61, 62, 63, 64 in such manner that the time duration which is necessary to fill a series register with information and to read out entirely a recorded series register, respectively, is equal to the time duration in which the information in the parallel registers is transferred over one bit length.

The common conductor 76 for controlling the charge transfer paths 67 is connected, as is the common conductor 78 for controlling the charge transfer paths 70 and 71, to the connection D of the pulse generator S. The common conductors 77 and 79 which serve respectively for controlling the charge transfer paths 68 and 72, are connected to the connection E of the pulse generator S.

The gate electrode of the transistor 84 is connected to the connection C of the pulse generator S.

The outputs of the series registers 64 and 65 are connected to a signal output 66 via diodes $D_2$.

The device described may be operated, for example as follows. The switching voltage source S supplies the voltages $V_A$ to $V_H$ shown in FIGS. 10A to 10H as a function of time t.

In the period $\tau_1$ the switch 84 ($V_C$) is closed and the input signal source $V_i$ is connected to the registers 61 and 62. By means of the clock voltages $V_A$ and $V_B$ and in the manner described in Netherlands Patent Application 66.15057, information in the form of charge packets is recorded in the registers 61 and 62 until the first information bit recorded in the register 62 has been stored in the last storage site of said register. The second information bit is then present in the last storage site but one of the register 61. The switch 84 ($V_C$) is now opened during the period $\tau_2$ so that the registers 61 and 62 are isolated from the signal source $V_i$.

It is to be noted that, if desired, a separate switch may be incorporated in each of the inputs 80 and 81 instead of the single switch 84, said switches being controlled by the same voltage $V_C$. Dependent on the practical application of the SPS memory, the switch 84 may also be omitted. When the memory is used, for example, as an image memory, the period $\tau_2$ may fall in the suppression time of the video signal $V_i$, $V_i$ being constant during the time $\tau_2$.

During the period $\tau_2$ the information recorded in the registers 61 and 62 is transferred to the first storage capacitance of the parallel registers 63. For that purpose a voltage equal to approximately twice the amplitude of the clock voltages $V_A$ and $V_B$ is set up at the electrodes 76 and 77. The potential minimum in the charge transport paths 67, 68, 69 will then be at approximately the same level as that at the storage sites of the registers 61 and 62 in which information is stored, that is to say the storage sites which are driven with the voltage $V_B$.

Simultaneously with the increase of the voltages $V_D$ and $V_E$ the voltage $V_A$ is also increased so that the intermediate charge storage sites of the registers 61 and 62 are also brought in the condition in which they can comprise a charge packet.

The clock voltage $V_F$ which drives the first storage sites of the registers 63 is now brought at its most positive value. If subsequently the voltages $V_B$, $V_D$, $V_A$ and $V_E$ are successively brought at their most negative value, the information content of the registers 61 and 62 has been transferred to the registers 63 at the end of the period $\tau_2$ and the registers 61, 62, and 63 are again isolated from each other so that a new period $\tau_1$ can begin in which new information is recorded in the registers 61 and 62. In this period $\tau_1$ the information in the registers 63 is transferred once by bringing the voltage $V_F$ to its most negative value and simultaneously the voltage $V_G$ to its most positive value. This voltage variation is not shown in FIGS. 10F and 10G.

The storage capacitances at the end of the registers 63 are driven with the voltage $V_G$. In the same period $\tau_2$ in which information of the registers 61 and 62 is transferred to the registers 63 information can also be transferred from the registers 63 to the registers 64 and 65.

The linking charge transfer paths 70 and 71 are driven with the same voltage $V_D$ as the charge transfer paths 67. Likewise the charge transfer path 72 is driven with the same voltage $V_E$ as the transfer paths 68 and 69. At the beginning of the period $\tau_2$ the charge transfer paths 70, 71 and 72 are opened for charge transfer.

Simultaneously, the one clock line of the output registers 64 and 65 connected to the connection A is brought at its most positive value. The voltage $V_H$ is set up at the second clock line of said registers and upon the transition from the period $\tau_1$ to the period $\tau_2$ is kept at its most positive value. In the periods $\tau_1$ the voltage $V_H$ is equal to the clock voltage $V_B$ of the input registers 61 and 62.

All charge storage capacitances of the output registers 64 and 65 as well as the last storage capacitances of the registers 63 are now in the condition in which they can comprise a charge packet. The voltages $V_G$, $V_D$, $V_A$ and $V_E$ now successively change to their most negative value, so that information transfer takes place from the registers 63 to the registers 64 and 65 and the registers 63, 64 and 65 are again isolated from each other. The information bit recorded first in one of the preceding periods $\tau_1$ and which, via the last storage site of the register 62 and along the last storage site of the register 61 and the extreme right register 63 has landed in the last storage site of the register 64, now appears at the output 66. When during the transition from the period $\tau_2$ to the next period $\tau_1$ the voltage $V_A$ is brought to its most positive value and the voltage $V_H$ is brought to its most negative value, the last storage site of the register 64 is reset via diode $D_1$ and simultaneously the information bit recorded as second shifts to the last storage capacitance of the register 65. The output 66 assumes the signal value determined by said information bit. So the information become available again at the output 66 in the same sequence in which it was recorded.

During the time the above-mentioned second information bit is available at the output 66 a new information bit is recorded at the beginning of the register 62. The two registers 64 and 65 may also each be elongated by one half bit length. In that case the reading-out of the above-mentioned first bit will coincide with the recording of a first information bit at the beginning of the register 62. The last bit of the array to be read out then appears immediately before the end of the relevant period $\tau_1$, after which said signal is maintained until the last storage capacitance of the (elongated register 65 is reset immediately before the end of the next period $\tau_2$ when the voltage $V_A$ changes to its most negative value.

It will be obvious that the present invention is not restricted to the embodiments described but that many variations are possible to those skilled in the art without departing from the scope of this invention. For example, the conductivity types stated in the examples may be interchanged in which the polarities of the voltages used are also adapted. Furthermore, any type and embodiment of charge transfer registers may be used, while for the linking or interconnecting charge transfer paths a choice may also be made from structures known for charge transfer devices.

In addition, to the diode circuit shown in FIG. 9 other output circuits may also be used at the outputs of the parallel arranged juxtaposed charge transfer registers. Furthermore, the signal at the input may be adapted and background charge (fat zero) for example may be added to the charge transfer capacitances. In the line sensor this may be done, for example, by means of a uniform background radiation which is incident on the image pick-up elements or one or both registers may be provided with an electric input via which the background charge is supplied electrically.

When registers having asymmetric potential wells below the electrodes are used, the number of parallel arranged registers between which the information is or is being distributed is equal to the number of phases or clock lines required for each of the registers, and in registers having symmetrical potential wells below the electrodes this number is equal to half the (even) number of phases of the registers.

What is claimed is:

1. A charge transfer device comprising a semiconductor body having a semiconductor layer, barrier means and a row of charge storage sites for storing mutually separated charge packets, read-out means for providing an output from said charge transfer device, a plurality of parallel-arranged juxtaposed charge transfer shift registers, each having an array of electrodes which are separated from said semiconductor layer of the semiconductor body by said barrier means and which form an array of capacitances with the underlying semiconductor material in which charge packets can be stored and be transferred to said read-out means, electrode means between the row of charge storage sites and the adjacent shift register and between adjacent shift registers which are separated from the semiconductor layer by said barrier means, for distributing charge packets stored in the row of charge storage sites between the shift registers, each of the shift registers receiving an equal part of the total number of the charge packets to be distributed, means for distributing to each shift register charge packets originally separated from each other in the row of storage sites by a number of intermediate charge packets equal to one less than the number of registers, the charge packets received by a selected shift register being supplied by said electrode means and with the exception of the first register via the registers present between said selected register and the row of storage sites, and means for shifting the charge packets distributed between the registers to the read-out means.

2. A charge transfer device comprising a semiconductor body having a semiconductor layer, barrier means and at least two parallel-arranged juxtaposed charge transfer registers each having an array of electrodes which are separated from said semiconductor layer of the semiconductor body by said barrier means and which, with the underlying semiconductor material and the barrier means, constitute an array of capacitances in which charge packets can be stored and be transferred along, means for recording information in the form of charge packets in each of the registers and having a row of charge storage sites for storing separate charge packets, electrode means between adjacent registers and between the register present beside the row of storage sites and said row, which are separated from the semiconductor layer by said barrier means, for controlling the transfer of the charge packets from one register to another and from the register present beside the row of storage sites to the storage sites, and means for selecting the positional sequence in which charge packets are transferred to said row of storage sites from successive parallel registers.

3. A charge transfer device as claimed in claim 2, wherein the number of parallel-arranged charge transport registers is equal to two.

4. A charge transfer device as claimed in claim 2, wherein the number of storage sites per unit of length of the row of charge storage sites is at most equal to the number of capacitances per unit of length of at least the charge transport register nearest to said row, and wherein charge packets can be stored simultaneously and separated from each other in said capacitances.

5. A charge transfer device as claimed in claim 2, wherein the charge transfer paths between two adjacent charge transfer registers along which information can be transferred from one register to the other are controllable by means of a common electrode which extends across said transfer paths.

6. A charge transfer device as claimed in claim 2, wherein corresponding electrodes of the charge transfer registers are connected together.

7. A charge transfer device as claimed in claim 1, wherein corresponding electrodes of the charge transfer registers are connected together to form groups of interconnected corresponding electrodes, the interconnected corresponding electrodes of each group extending in line and within a substantially straight band running substantially perpendicular to the charge transfer registers, the charge transfer paths between adjacent transfer registers along which information can be transferred from one register to the other being present between first capacitances of the one register and second capacitances of the adjacent other register and extending obliquely with respect to said straight bands, and wherein for each of the first capacitances the electrode belonging to said first capacitance forms part of a group of interconnected corresponding electrodes other than the group including the electrode belonging to the second capacitance coupled to said first capacitance by a charge transfer path.

8. A charge transfer device as claimed in claim 1, wherein the row of charge storage sites and the parallel-arranged registers form part of an image pick-up device in which the registers serve to read out image information.

9. A charge transfer device as claimed in claim 8, wherein the image pick-up device comprises a row of pick-up elements and the charge storage sites of the row are each coupled to one pick-up element of the row of pick-up elements.

10. A charge transfer device as claimed in claim 9, wherein at least two parallel-arranged registers for reading out image information are provided on each of both opposite sides of the row of pick-up elements and wherein the charge transfer paths between the row of storage sites and the parallel-arranged registers couple every second storage site of the row to register provided on a first one of said both opposite sides and every remaining storage site of the row to a register provided on a second one of said opposite sides.

11. A charge transfer device as claimed in claim 1, further comprising a plurality of auxiliary charge transport registers, wherein the row of charge storage sites and the parallel-arranged charge transfer registers form part of a series-parallel-series memory, the charge storage sites of the row each comprising a charge storage capacitance of a selected auxiliary charge transport register, the auxiliary registers being arranged beside each other and transversely to the row of charge storage sites and the number of auxiliary registers being equal to the number of storage sites of the row, and wherein means are provided for enabling charge transfer in the registers present parallel to the row of charge storage sites to occur more rapidly and at a higher transfer frequency than charge transfer in the auxiliary registers.

12. A charge transfer device comprising, in a common semiconductor body, a charge transfer serial register for storing a stream of signal bits and comprising a plurality of charge storage stages each comprising first and second adjacent storage sites per signal bit and means for transferring charge packets representing signal bits along successive stages of the register, means for introducing charge packets into said first storage site of each stage of the register, means for introducing charge packets originating outside of the register into said second storage sites of of the register whereby both adjacent storage sites are simultaneously occupied, and means for transferring charge packets from said occupied storage sites to locations outside the register.

13. A charge transfer device having a semiconductor body and a plurality of electrodes separated therefrom by a barrier, which comprises:
(a) a row of charge storage sites in the body for storing separate charge packets;
(b) a first charge transfer register for storing in register sites and transferring along the register separate charge packets;
(c) a second charge transfer register for storing in register sites and transferring along the register separate charge packets, said second register being parallel to and adjacent said first register;
(d) means for transferring charge packets through said first charge transfer register in a direction transverse to the direction of transfer along said registers between a first group of spaced storage sites in the row of storage sites and said second charge transfer register; and
(e) means for transferring charge packets in a direction transverse to the direction of transfer along said registers between a second group of spaced storage sites in the row of storage sites and said first charge transfer register subsequent the the transfer of charge packets from said first group of storage sites through said first charge register.

* * * * *

UNITED STATES PATENT AND TRADEMARK OFFICE
CERTIFICATE OF CORRECTION

PATENT NO. : 4,131,950
DATED : December 26, 1978
INVENTOR(S) : JOHANNES G. VAN SANTEN It is certified that error appears in the above–identified patent and that said Letters Patent are hereby corrected as shown below:

Claim 10, line 7, "to register" should be --to a register--

Signed and Sealed this

First Day of May 1979

[SEAL]

Attest:

RUTH C. MASON
Attesting Officer

DONALD W. BANNER
Commissioner of Patents and Trademarks